(12) United States Patent
Komai

(10) Patent No.: US 6,291,766 B1
(45) Date of Patent: Sep. 18, 2001

(54) DUMMY SURFACE PLATE AND HOUSING

(75) Inventor: Hidetaka Komai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,215

(22) Filed: Mar. 16, 2000

(30) Foreign Application Priority Data

Jun. 18, 1999 (JP) ................................................ 11-171890

(51) Int. Cl.[7] ...................................................... H05K 9/00
(52) U.S. Cl. ...................... 174/35 R; 361/800; 361/816; 361/796; 361/797; 361/801; 361/725; 361/727
(58) Field of Search ............................ 174/35 R, 35 GC; 361/800, 816, 818, 796, 797, 801, 725, 727

(56) References Cited

U.S. PATENT DOCUMENTS

| | | | |
|---|---|---|---|
| 6,043,991 | * 3/2000 | Sorrentino | 361/816 |
| 6,078,504 | * 6/2000 | Miles | 361/727 |
| 6,134,119 | * 10/2000 | Gunther et al. | 361/800 |
| 6,137,052 | * 10/2000 | Kurrer et al. | 174/35 GC |

OTHER PUBLICATIONS

Abstract: "Package Protected Against EMI"; Motosako Toshihiko et al.; Fujitsu Ltd. Nippon Telegr & Teleph Corp. NTT; Publication No. 09018183 A, published Jan. 17, 1997.

* cited by examiner

*Primary Examiner*—Dean A. Reichard
*Assistant Examiner*—Hung V Ngo
(74) *Attorney, Agent, or Firm*—Rabin & Berdo, P.C.

(57) ABSTRACT

This invention provides a dummy surface plate for shielding a partial region of an insertion opening of an electronic device housing. The electronic device housing has a first frame and a second frame. The dummy surface plate includes a main plate, a first edge which has a front face contact for contacting the front face of the first frame, a protrusion for fitting into a groove formed on the first frame, and a latch head for moving between a latching position and an unlatching position, and a second edge which has a front face contact for contacting the front face of the second frame, a protrusion for fitting into a groove formed on the second frame, and a rear face contact for contacting the rear face of the second frame.

12 Claims, 5 Drawing Sheets

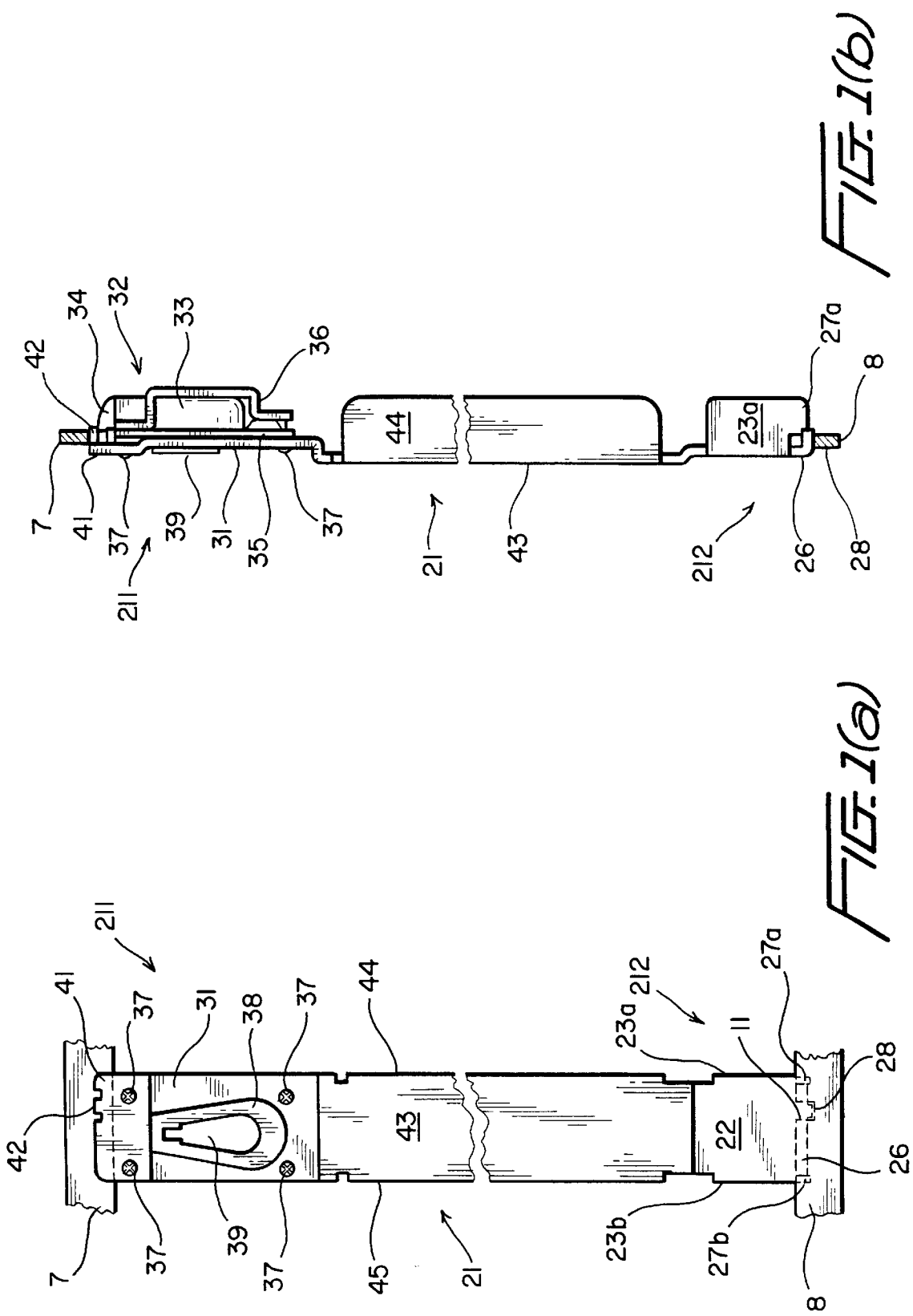

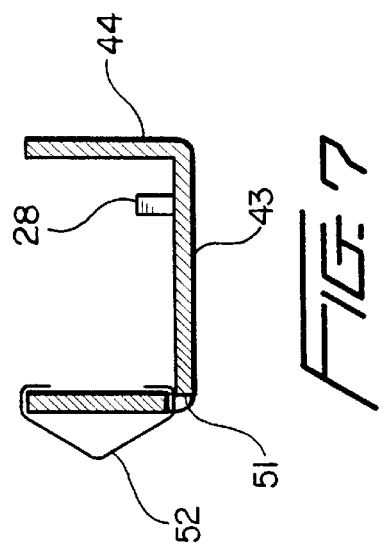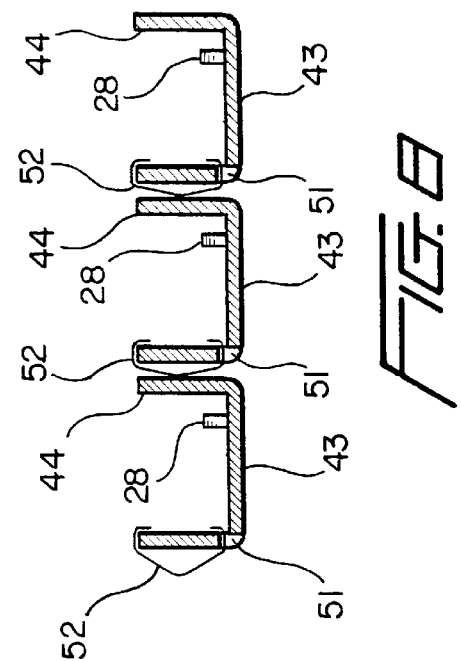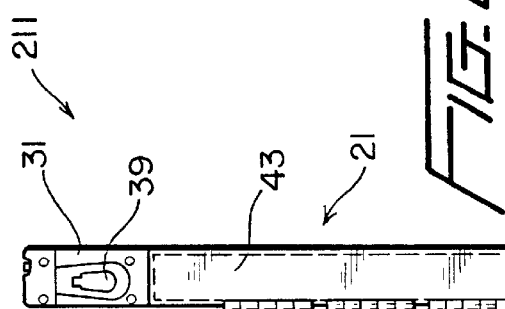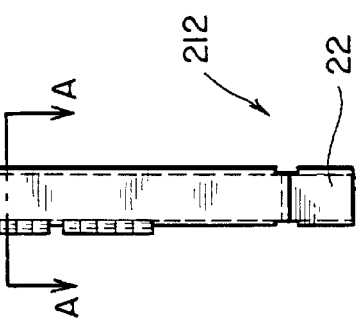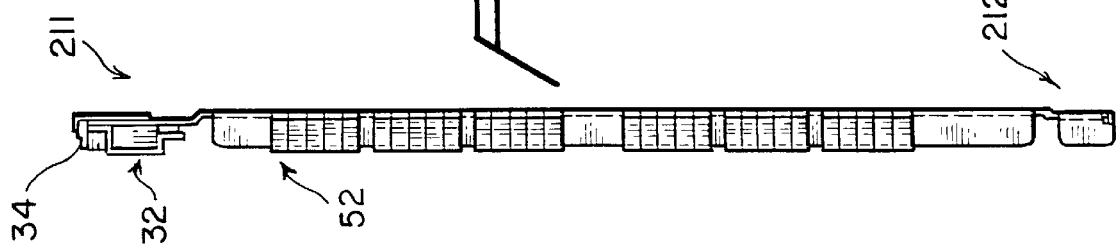

DUMMY SURFACE PLATE AND HOUSING

CROSS REFERENCE TO RELATED APPLICATION

This application claims the priority of Japanese application Ser. No. 171890/1999 filed Jul. 18, 1999, the subject matter of which is incorporated herein by reference.

BACKGROUND OF THE INVENTION

1. Field of the Invention

This invention relates generally to a dummy surface plate, more particularly relates to a dummy surface plate, which shields an insertion opening of housing. The housing is adapted to be used for storing a plurality of plate members inserted from the insertion opening so as to be arranged in parallel. Moreover, this invention relates to a housing which includes a dummy surface plate for shielding the insertion opening of the housing.

2. Description of Related Art

Conventionally, as a housing having an insertion opening, an electronic device housing such as a communication device, a computer, or a switching device is known. A plurality of printed boards as a plate member on which electronic components as an Integrated Circuit(IC) or a Large Scale Integration(LSI) are mounted, are inserted into or removed from the opening of the electronic device housing.

Generally, the rise in inside temperature of the electronic device housing occurs by the heat generated from the electronic components mounted on the printed board, which is stored in the electronic device housing. In order to prevent the rise in this temperature, a cooling fan is used for cooling the inside of the electronic device housing forcedly. In this case, a surface plate is attached to the opening so as to prevent the cooling air from leaking out to the outside of the electronic device housing.

Conventionally, the surface plate shown in FIG. 9 is known as an above-described surface plate. FIG. 9 shows a perspective view of a conventional dummy surface plate attached to a partial region of the opening of the electronic device housing.

As shown in FIG. 9, an electronic device housing 1 has an insertion opening 3. The insertion opening 3 allows insertion and removal of a plurality of printed boards in parallel with each other. In the following description, a part of the electronic device housing 1 where the insertion opening 3 is will be referred to also as a front part of the electronic device housing 1, and an opposite part of the electronic device housing 1 will be referred to also as a back part of the electronic device housing 1.

A back panel 4 is attached to the back part of the electronic device housing 1. A connector which is not shown is mounted on the back panel 4. A connector 6 is mounted on a printed board 2. When the printed board 2 was inserted into the insertion opening 3, the connector 6 is connected with the above-described connector mounted on the back panel 4. On the printed board 2, a plurality of electronic components, as the IC or LSI, are mounted. A panel is attached to a part of the electronic device housing 1 except for the front part and back part. An upper frame 7, as a first frame, and a lower frame 8, as a second frame, are formed in upper part and lower part of the insertion opening 3. The upper frame 7 and lower frame 8 are corresponding to an upper edge and lower edge of the printed board 2. The upper frame 7 has a plurality of grooves 9. The lower frame 8 has a plurality of grooves 11. The grooves 9 and grooves 11 are opposite each other in every slot. The upper edge (first edge) and lower edge (second edge) of the printed board 2 are guided slidably by the groove 9 and groove 11. The electronic device housing 1 has a plurality of upper grooves 12 inside, which guide the upper edge of the printed board 2 inserted into or removed from inside of the electronic device housing 1. Similarly, the electronic device housing 1 has a plurality of lower grooves which are not shown. The lower grooves guide the lower edge of the printed board 2 inserted into or removed from inside of the electronic device housing 1. The lower grooves correspond to the upper grooves 12 respectively. The printed board 2 has a surface plate 13 on a front edge, which is fixed by non-shown screws. The surface plate 13 shields the partial region of the insertion opening 3, in case the printed board 2 is inserted into the electronic device housing 1.

A grip lever 14 is fixed on upper end portion of the surface plate 13, and a grip lever 16 is fixed on lower end portion of the surface plate 13. The grip lever 14 has a construction which make the grip lever be a lock condition or an unti-lock condition. The lock condition is meant that the grip lever 14 is prevented itself to move relatively in direction between the front face and the rear face of the upper frame 7. The unti-lock condition is meant that the grip lever 14 is made itself be able to move relatively in direction between the front face and the rear face of the upper frame 7. The grip lever 16 has the same construction with the grip lever 14.

When the printed board 2 is inserted into the electronic device housing 1 through the partial region of the insertion opening 3, the grip lever 14 and 16 are in the unti-lock condition. After the printed board 2 is inserted into electronic device housing 1 and when the printed board 2 is stored inside of the electronic device housing 1, the grip lever 14 and 16 become being in the lock condition. The operation of inserting the printed board 2 into the electronic device housing 1 is done as descripted above. When the printed board 2 is removed from the electronic device housing 1 through the partial region of the insertion opening 3, the grip lever 14 and 16 are in the unti-lock condition. Such as the grip lever 14 and 16 are conventional construction, and descripted in Japanese patent applications, laid-open No. 9-18183.

In order to increase the cooling efficiency inside of the electronic device housing 1, it is needed that all region of the insertion opening 3 is shielded so that the cooling air inside of the electronic device housing 1 does not leak out to outside of the electronic device housing 1. For this reason, it is needed that the unused partial region of the insertion opening 3 is shielded. However, since the surface plate 13 and grip lever 14 and 16 shown as FIG. 9 are fixed to the printed board 2, the surface board 13 and grip lever 14 and 16 are conventionally fixed to a dummy printed board on which no electronic component is mounted in order to shield the unused slot.

In this case, since the number of parts for shielding the unused partial region of the insertion opening 3 is increased, the cost and the constructing work for the dummy printed board with the surface board 13, the grip lever 14 and 16 are increased. Moreover, it is necessary for the electronic device housing 1 to take electromagnetic shielding measures for preventing electromagnetic interference (EMI). As one of the measures, it is known that a plurality of metal springs for electromagnetic shielding are mounted on the each surface plate 13 so that each surface plate 13 is kept in pressure contact with each other.

However, though the conventional surface plate 13 as shown in FIG. 9 has the construction which prevents itself moving relatively in the front or the rear direction to the upper flame 7 and lower frame 8, it dose not have the construction which prevents itself moving in direction along the upper frame 7 and lower frame 8.

For this reason, when a plurality of printed boards 2 or dummy printed boards with the surface board 13, the grip lever 14 and 16 are inserted into the electronic device housing 1 through the insertion opening 3, the elastic power is generated from each metal spring. As the number of dummy printed boards with the surface board 13, the grip lever 14 and 16 or printed boards 2 increases, the total elastic power of each elastic power increases. In this case, each surface plate 13 moves in direction along the upper and lower frame 7 and 8. In this case, the conventional construction causes a reduction in working efficiency of an insertion or a removal of the dummy printed boards with the surface board 13, the grip lever 14 and 16 or the printed boards 2.

SUMMARY OF THE INVENTION

An object of the present invention is to reduce the production cost of a dummy surface plate for shielding a partial region of an insertion opening of a housing.

To achieve the above-described object of the present invention, according to the present invention, there is provided a dummy surface plate for shielding a partial region of an insertion opening of a housing, said housing having a first frame and a second frame for guiding a first and second edges of a board member slidably, said dummy surface plate comprising:

a main plate;

a first edge formed on one of edge portion of said main plate, said first edge having a front face contact for contacting with the front face of said first frame, a protrusion for fitting into a groove formed on said first frame, and a latch head for moving between a latching position and an unlatching position in said latching position said latch head contacts with a rear face of said first frame when said first edge is attached to said first frame, in said unlatching position said latch head discontacts with said rear face of said first frame when said first edge is attached to said first frame; and a second edge formed on the other edge portion of said main plate, said second edge having a front face contact for contacting with a front face of said second frame, a protrusion for fitting into a groove formed on said second frame, and a rear face contact for contacting with a rear face of said second frame.

Moreover, an object of the present invention is to provide a housing which includes a dummy surface plate for shielding a partial region of an insertion opening of a housing, which is reduced the production cost.

To achieve the above-described object of the present invention, according to the present invention, there is provided an electronic device housing assembly comprising:

a housing for including an insertion opening, said housing having a first frame and a second frame for guiding a first and second edges of a board member slidably; and a dummy surface plate for shielding a partial region of said insertion opening; and wherein said dummy surface plate comprises;

a main plate;

a first edge formed on one of edge portion of said main plate, said first edge having a front face contact for contacting with the front face of said first frame, a protrusion for fitting into a groove formed on said first frame, and a latch head for moving between a latching position and an unlatching position in said latching position said latch head contacts with a rear face of said first frame when said first edge is attached to said first frame, in said unlatching position said latch head discontacts with said rear face of said first frame when said first edge is attached to said first frame; and a second edge formed on the other edge portion of said main plate, said second edge having a front face contact for contacting with a front face of said second frame, a protrusion for fitting into a groove formed on said second frame, and a rear face contact for contacting with a rear face of said second frame.

BRIEF DESCRIPTION OF THE DRAWINGS

FIG. 1($a$) is a front view of a dummy surface plate in a first embodiment of the present invention.

FIG. 1($b$) is a side view of FIG. 1($a$).

FIG. 6($a$) is a side view of a dummy surface plate in a second embodiment of the present invention.

FIG. 6($b$) is a front view of FIG. 6($a$).

FIG. 7 is a sectional view on the plane of lines A—A of FIG. 6($b$).

FIG. 8 is a view similar to FIG. 7 illustrating a plurality of dummy surfaces are attached the opening of the electronic device housing.

DESCRIPTION OF THE PREFERRED EMBODIMENTS

Preferred embodiments of the present invention will be described with reference to the drawings, but the present invention is not limited to the following embodiments.

First Embodiment

Figure 3:
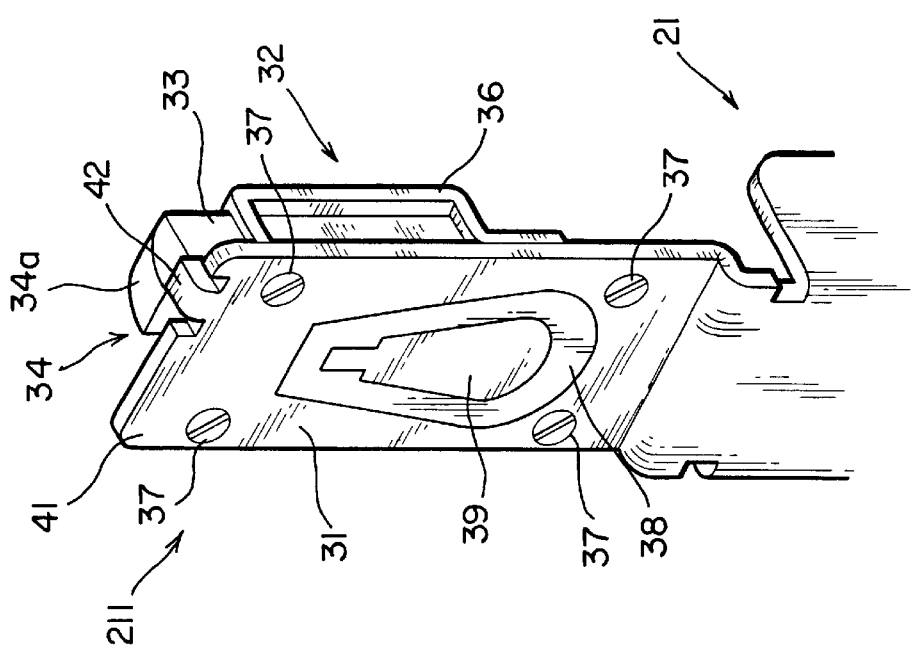
FIG. 3 is an enlarged partly perspective view of FIG. 1.
Figure 2:
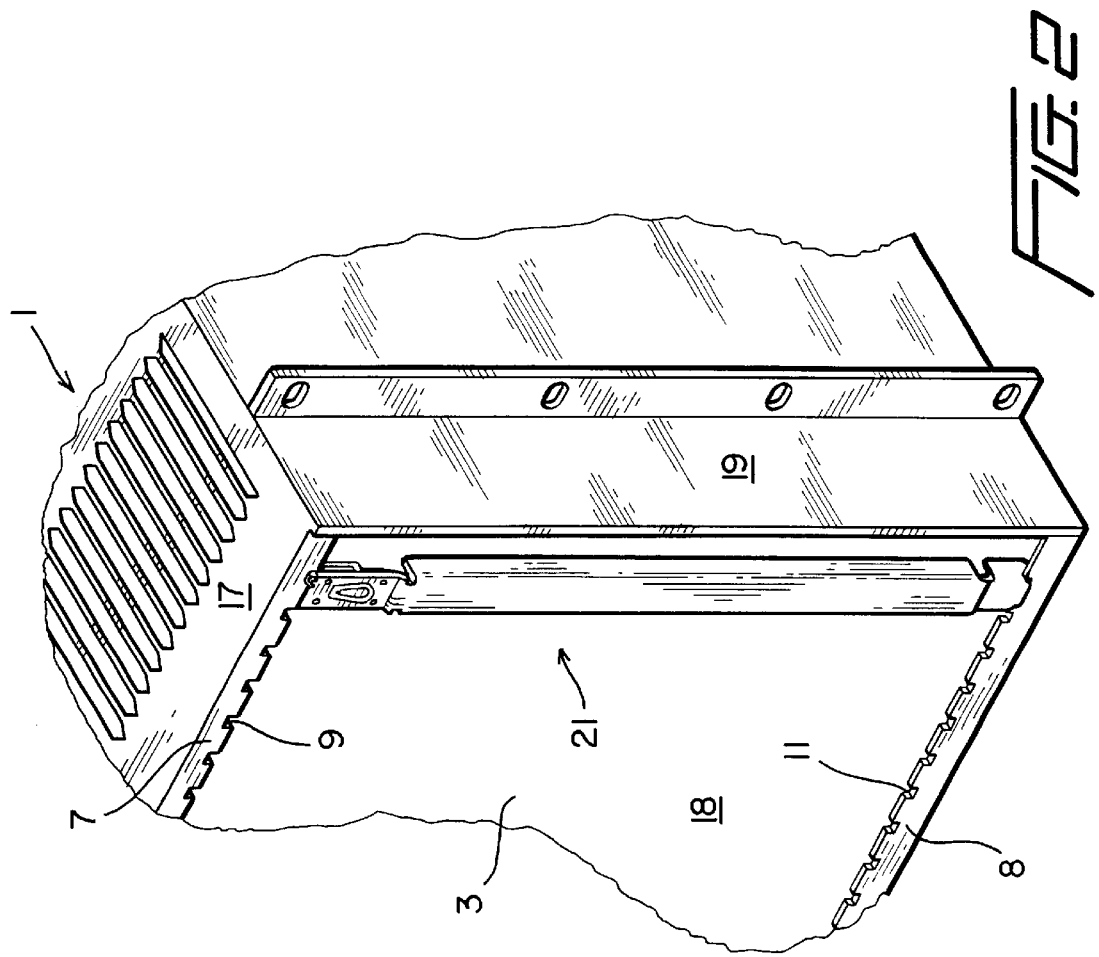
FIG. 2 is a perspective view of a dummy surface of FIG. 1 attached to a partial region of an opening of an electronic device housing.
Figure 4:
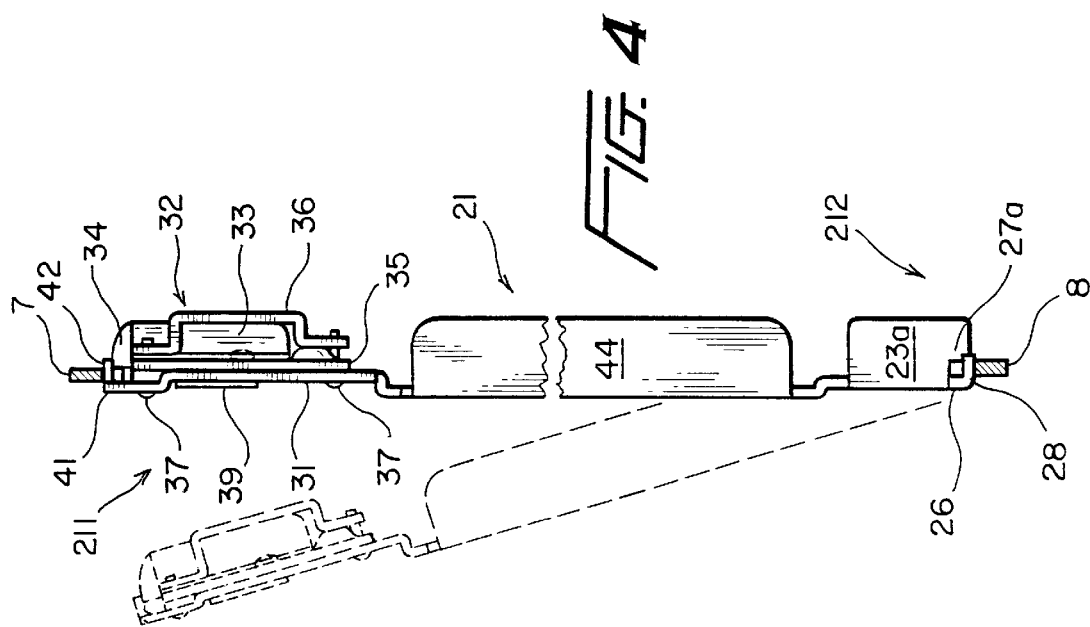
FIG. 4 is a side view of FIG. 1 illustrating an action, the dummy surface plate is attached to the opening of the electronic device housing.

First, a first embodiment of the present invention will be described with reference to the drawings from FIG. 1 to FIG. 5. FIG. 1($a$) shows a front view of a dummy surface plate in a first embodiment of the present invention. FIG. 1($b$) shows a side view of FIG. 1($a$). FIG. 2 shows a perspective view of a dummy surface of FIG. 1 attached to a partial region of an opening of an electronic device housing. FIG. 3 shows an enlarged partly perspective view of FIG. 1. FIG. 4 shows a side view of FIG. 1 illustrating an action, the dummy surface plate is attached to the opening of the electronic device housing. FIG. 5 shows an enlarged partly side view of FIG. 1. Illustrating an action, the dummy surface plate is detached from the insertion opening of the electronic device housing, FIG. 5($a$) shows an enlarged partly side view of FIG. 1($b$) illustrating an attached dummy surface plate to the opening, FIG. 5($b$) shows an enlarged partly side view of FIG. 1($b$) illustrating detached dummy surface plate from the opening.

Figure 9:
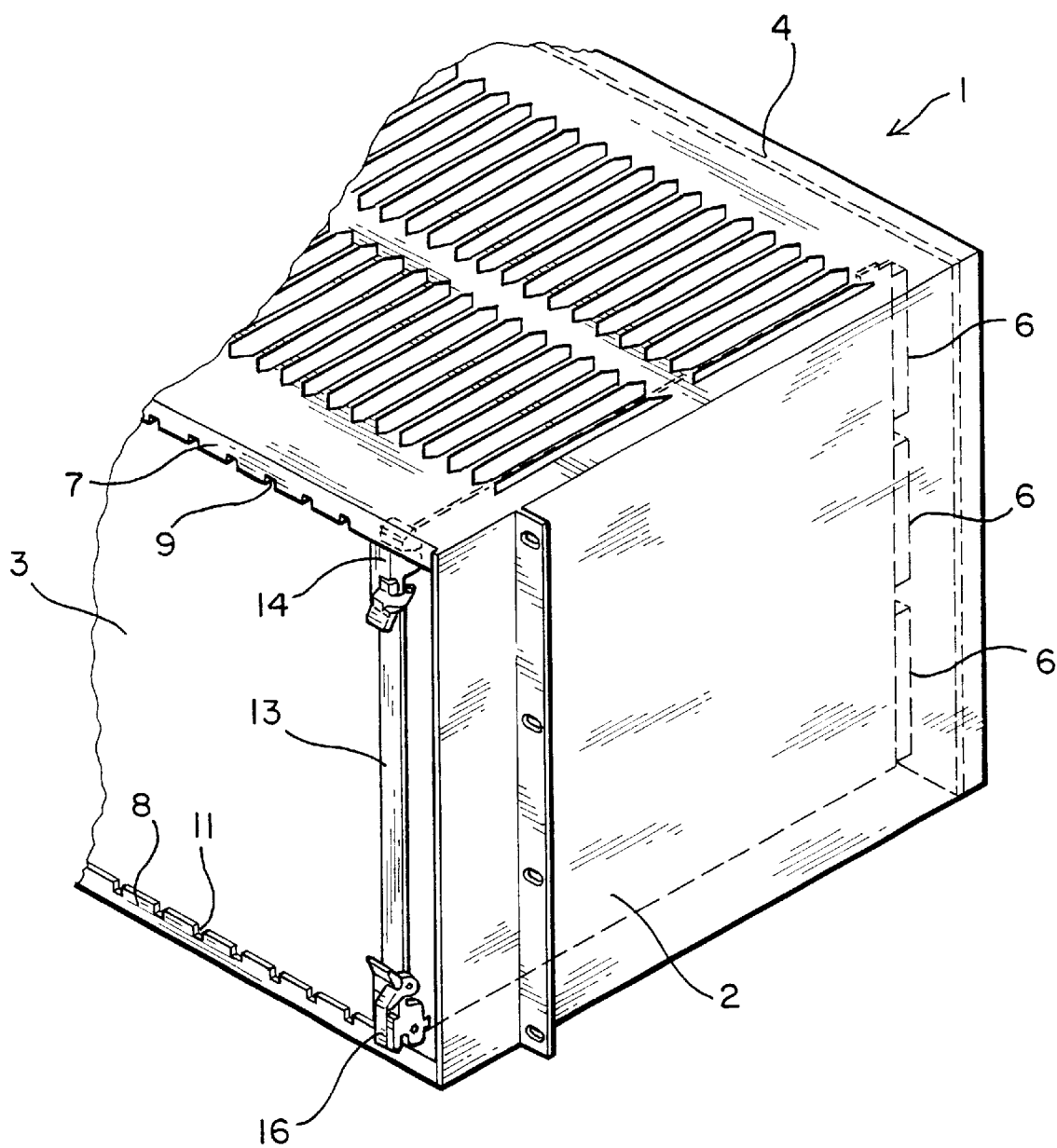
FIG. 9 is a view similar to FIG. 2 of a conventional dummy surface.

In the description of the first embodiment, the constituting elements corresponding to the constituting elements shown in FIG. 9 are denoted with the same reference numerals, and the detailed description thereof is omitted.

As shown in FIG. 2, a dummy surface plate 21 of the first embodiment of the present invention is attached the electronic device housing 1. The electronic device housing 1 has a back panel 4(shown in FIG. 9), an upper panel 17, a lower panel 18, and a side panel 19. The electronic device housing 1 has a side panel which is not shown in FIG. 2. The unshown side panel is opposite to the side panel 19. The back panel 4(shown in FIG. 9), the upper panel 17, the lower panel 18, the side panel 19, and the unshown side panel constitute a insertion opening 3.

As shown in FIG. 1(a), the dummy surface plate 21 has a first edge 211 on upper edge of itself. The dummy surface plate 21 has a second edge 212 on lower edge of itself. The second edge 212 includes a lower face portion 22. The second edge 212 includes a lower side face portion 23a and 23b. As shown in FIG. 1(a) and FIG. 1(b), the lower side face portion 23a and 23b extends from both side of the lower face portion 22 to the rear side of the side face portion 22.

A lower face portion 22 has a front face contact 26 for contacting with a front face of the lower frame 8. The front face contact 26 contacts with the front face of the frame 8 when the second edge 212 is attached to the lower frame 8. The side face portion 23a has a projection 27a to contact with the rear face of the lower frame 8. The side face portion 23b has a projection 27b to contact with the rear face of the lower frame 8. The projection 27b corresponds to the projection 27a. The second edge 212 is prevented to move relatively in direction between a front face and a rear face of the frame 8, since the frame 8 is engaged between front face contact 26 and rear face contact 27a and 27b.

The second edge 212 includes a protrusion 28 extending from the front face contact 26 to the rear side of itself. The protrusion 28 fits into the groove 11, when the second edge 212 is attached to the lower frame 8. The second edge 212 is prevented to move relatively in direction along the frame 8, so that the protrusion 28 is fitted into the groove 11.

The first edge 211 includes an upper face portion 31. As shown in FIG. 1(b), latch device 32 is mounted on rear face of the upper face portion 31. As shown in FIG. 1(b) and FIG. 3, the latch device 32 has a latch case 33 mounted on the rear face of the upper face portion 31. A latch head 34 is housed in the latch case 33. The latch head 34 is movable in direction along a inside face of the latch case 33 between a latching position and an unlatching position. The latching position is the position wherein the latch head 34 protrudes from the upper side of the latch case 33 and contacts with the rear face of the upper frame 7 when the first edge 211 is attached to the upper frame 7. The unlatching position is the position wherein the latch head 34 retreats into the latch case 33 and discontacts with the rear face of the first frame 7 when the first edge 211 is attached to the upper frame 7. The latch head 34 has a contacting face 34a which slopes down from the front to rear of the latch head 34. The latch case 33 has a spring which is not shown inside, which pushes the latch head 34 in protrusive direction along the latch case 33. The latch head 34 is held in the latching position by virtue of the spring which is not shown.

The latch case 33 is held between a case fix member 35 and 36. The case fix member 35 and 36 are mounted on the rear face of upper face portion 31 by virtue of a plurality of screws 37. A penetrating hole 38 is formed on the upper face portion 31. The penetrating hole 38 penetrates the upper face portion 31. A lever 39 is mounted in the penetrating hole 38. The lever 39 may pivot around a pin which is mounted in the latch case 33 and is not shown. The penetrating hole 39 is used for retracting the latch head 34 into the latch case 33 by pivoting around the unshown pin mounted in the latch case 33. The latch device 32 has a construction, in which the latch head 34 retreats from the upper side of the latch case 33 if the lever 39 is pulled. The lever 39 operates the latch head 34 to move between the latching position of the latch head 34 to the unlatching position of the latch head 34.

The dummy surface plate 21 has a front face contact 41 which contacts with the front face of the frame 7 when the first edge 211 is attached to the upper frame 7. The first edge 211 is prevented to move relatively in direction between a front face and a rear face of the frame 7, since the frame 7 is engaged between the front face contact 41 and the latch head 34. The first edge 211 includes a protrusion 42 extending from the front face contact 41 to rear side of itself. The protrusion 41 fits into the groove 9 when the first edge 211 is attached to the upper frame 7. The first edge 211 is prevented to move relatively in direction along the frame 7, since the protrusion 41 is fitted into the groove 9.

As shown in FIG. 1(b), the dummy surface plate 21 has a main plate 43 and side plates 44 and 45 between the lower face portion 22 and upper face portion 31. The side plates 44 and 45 extend from both side of the main plate 43 to the rear side of the main plate 43. In the first embodiment of the present invention, the components given the reference numerals from 22 to 44 may be adopted the components made of conductive metal.

An operation attaching the dummy surface plate 21 to the insertion opening 3 will be described as follows.

As shown in FIG. 4, when the partial region of the insertion opening 3 is shielded by the dummy surface plate 21, the lower face portion 212 is attached to the frame 8 firstly, which is shown by the double-dotted chain line. Then, the front face contact 26 contacts with the front face of the frame 8, and the rear face contacts 27a and 27b contact with a rear face of the frame 8. Thus, the second edge 212 is prevented to move relatively in direction between a front face and a rear face of the frame 8. And then, the protrusion 28 fits into the groove 11, so that the second edge 212 is prevented to move relatively in direction along the frame 8. Secondly, when the dummy surface plate 21 is rotated about the frame 8 in the direction of the frame 7, the contacting face 34a contacts with the frame 7. If the dummy surface plate 21 is rotated continually, the contacting face 34a receives a power from the frame 7 to make the latch head 34 move in the direction of the latch case 33. Thus, the latch head 34 is pushed back and moves so as to keep the contacting face 34a contacting with the upper frame 7. If the dummy surface plate 21 is rotated continually, as shown FIG. 5(a), the rotation of the dummy surface plate 21 is stopped since the front face contact 41 contacts with the front face of the upper frame 7. Then, the latch head 34 is in the latching position since the contact between the contacting face 34a and the upper frame 7 is canceled. The latch head 34 canceled the contact with the upper frame 7 is pushed in protrusive direction along the latch case 33 by the spring which is not shown, and the latch head 34 is held in the latching position. The latch head 34 held in the latching position contacts with the rear face of the upper frame 7. The first edge 211 is prevented to move relatively in direction between a front face and a rear face of the frame 7, since the frame 7 is engaged between the front face contact 26 and the latch head 34. Moreover, the first edge 211 is prevented to move relatively in direction along the frame 7, since the protrusion 41 is fitted into the groove 9.

An operation of detaching the dummy surface plate 21 from the insertion opening 3 will be described as follows.

Figure 5B:
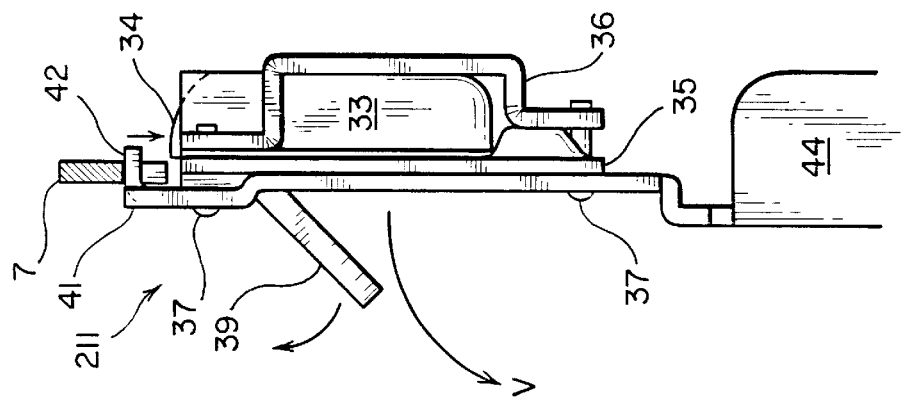
FIG. 5($a$) is an enlarged partly side view of FIG. 1. Illustrating an attached dummy surface plate to the opening, FIG. 5($b$) is an enlarged partly side view of FIG. 1($b$) illustrating detached plate from the opening.
Figure 5A:
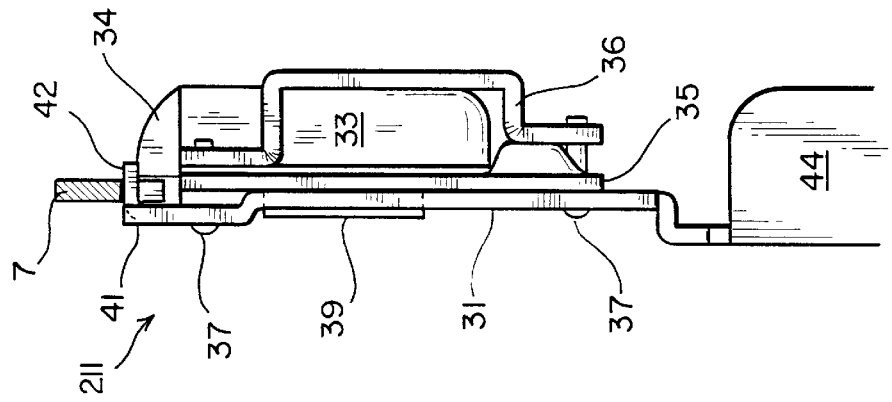

As shown in FIG. 5(a), the latch head 34 is held in the latching position when the first edge 211 is attached to the upper frame 7. In case that the dummy surface plate 21 is detached from the insertion opening 3, as shown in FIG. 5(b), the latch head 34 is moved by virtue of the lever 39, and retracted into the latch case 33. Thus, the contact between the latch head 34 and the rear face of the frame 7 is canceled. The dummy surface plate 21 becomes rotatable about the frame 8.

As described above, in the first embodiment, the production cost of the dummy surface plate 21 is minimized since the plurality of partials of the insertion opening 3 are shielded by virtue of dummy surface plate 21 only. Moreover, the constructing work for the dummy surface plate 21 is reduced. Moreover, the operation for attaching or detaching the dummy surface plate 21 can be improved.

Second Embodiment

A second embodiment of the present invention will next be described with reference to the drawings from FIG. 6 to FIG. 8. FIG. 6(a) shows a side view of a dummy surface plate in a second embodiment of the present invention. FIG. 6(b) shows a front view of FIG. 6(a). FIG. 7 shows a sectional view on the plane of lines A—A of FIG. 6(b). FIG. 8 shows a view similar to FIG. 7 illustrating a plurality of dummy surfaces are attached the opening of the electronic device housing.

In the description of the second embodiment, the constituting elements corresponding to the constituting elements of the first embodiment are denoted with the same reference numerals, and the detailed description thereof is omitted. The second embodiment is different from the first embodiment in the following respects, but constituted in the same manner as the first embodiment in the other respects.

As shown in FIG. 6 and FIG. 7, a plurality of penetrating holes 51 are formed on the bent portion between the main plate 43 and one of the side plates 44, 44 of the dummy surface plate 21. A plurality of metal springs 52 for electromagnetic shielding are mounted on the side plates 44 so as to be arranged at given intervals. A both ends of the metal spring are caught by end of the side plate 44 and the plurality of penetrating holes 51. As shown in FIG. 8, plurality of metal spring 51 magnetically shields a gap between the dummy surface plates adjacent to each other or a gap between one of the dummy surface plate and the electronic device housing 1.

According to the second embodiment, when a plurality of dummy surface 21 are attached to the upper frame 7 and lower frame 8, the elastic powers of metal springs 51 of the individual dummy surface plate 21 are added each other. Thus, the total elastic power of each elastic power of dummy surface plates 21 is generated in direction along the frame 7 and 8. Though each dummy surface is urged in direction along the frame 7 and 8, the first and second edge portion 211 and 212 are prevented to move relatively in direction along the frame 7 and 8.

As described above, in the second embodiment, the electoromagneticaly shielding of the electronic device housing 1 can be improved to thereby reduce the occurrence of electromagnetic interference during normal operation without reducing in working efficiency.

While particular embodiments of the present invention have been described and illustrated, it should be understood that the invention is not limited thereto since modifications may be made by persons skilled in the art. The present application contemplates any and all modifications that fall within the spirit and scope of the underlying invention described and claimed herein.

Other Embodiments

The preferred embodiments of the present invention have been described above in detail, but the present invention is not limited to the above-described embodiments, and can variously be modified in the scope of the present invention described in claims. The other embodiments of the present invention will next be described.

(1) In the first or second embodiment, the dummy surface plate 21 may have a second edge which has the same construction of the first edge of the dummy surface plate.

What is claimed is:

1. A dummy surface plate for shielding a partial region of an insertion opening of a housing, said housing having a first frame and a second frame for guiding a first and second edges of a board member slidably, said dummy surface plate comprising:

a main plate;

a first edge formed on one of edge portion of said main plate, said first edge having a front face contact for contacting with the front face of said first frame, a protrusion for fitting into a groove formed on said first frame, and a latch head for moving between a latching position and an unlatching position in said latching position said latch head contacts with a rear face of said first frame when said first edge is attached to said first frame, in said unlatching position said latch head discontacts with said rear face of said first frame when said first edge is attached to said first frame; and a second edge formed on the other edge portion of said main plate, said second edge having a front face contact for contacting with a front face of said second frame, a protrusion for fitting into a groove formed on said second frame, and a rear face contact for contacting with a rear face of said second frame.

2. A dummy surface plate of claim 1, wherein said second edge comprises:

said rear face contact for moving between a latching position and an unlatching position , in said latching position said rear face contact contacts with said rear face of said second frame when when said second edge is attached to said second frame, in said unlatching position said rear face contact discontacts with said rear face of said second frame when when said second edge is attached to said second frame.

3. A dummy surface plate of claim 2, wherein said rear face contact comprises:

a contacting face which slopes down to said second frame, whereby when said second edge is attached to said second frame, said rear face contact moves between said latching position of said rear face contact and said unlatching position of said rear face contact so as to keep said contacting face contacting with said second frame.

4. A dummy surface plate of claim 1, wherein said latch head comprises:

a contacting face which slopes down to said first frame, whereby when said first edge is attached to said first frame, said latch head moves between said latching position of said latch head and said unlatching position of said latch head so as to keep said contacting face contacting with said first frame.

5. A dummy surface plate of claim 1, wherein said dummy surface plate further comprises:

a lever mounted on said first edge, for operating said latch head to move between said latching position of said latch head to said unlatching position of said latch head.

6. A dummy surface plate of claim 1, wherein said dummy surface plate further comprises:

a plurality of elastic members mounted on said dummy surface plate, for shielding a gap between said partial region and an adjacent partial region of said insertion opening.

7. An electronic device housing assembly comprising:

a housing for including an insertion opening, said housing having a first frame and a second frame for guiding a first and second edges of a board member slidably; and a dummy surface plate for shielding a partial region of said insertion opening; and wherein said dummy surface plate comprises;
a main plate;
a first edge formed on one of edge portion of said main plate, said first edge having a front face contact for contacting with the front face of said first frame, a protrusion for fitting into a groove formed on said first frame, and a latch head for moving between a latching position and an unlatching position, in said latching position said latch head contacts with a rear face of said first frame when said first edge is attached to said first frame, in said unlatching position said latch head discontacts with said rear face of said first frame when said first edge is attached to said first frame; and
a second edge formed on the other edge portion of said main plate, said second edge having a front face contact for contacting with a front face of said second frame, a protrusion for fitting into a groove formed on said second frame, and a rear face contact for contacting with a rear face of said second frame.

8. An electronic device housing assembly of claim 7, wherein said second edge of said dummy surface plate comprises:

said rear face contact for moving between a latching position and an unlatching position , in said latching position said rear face contact contacts with said rear face of said second frame when when said second edge is attached to said second frame, in said unlatching position said rear face contact discontacts with said rear face of said second frame when when said second edge is attached to said second frame.

9. An electronic device housing assembly of claim 8, wherein said rear face contact comprises:

a contacting face which slopes down to said second frame, whereby when said second edge is attached to said second frame, said rear face contact moves between said latching position of said rear face contact and said unlatching position of said rear face contact so as to keep said contacting face contacting with said second frame.

10. An electronic device housing assembly of claim 7, wherein said latch head comprises:

a contacting face which slopes down to said first frame, whereby when said first edge is attached to said first frame, said latch head moves between said latching position of said latch head and said unlatching position of said latch head so as to keep said contacting face contacting with said first frame.

11. An electronic device housing assembly of claim 7, wherein said dummy surface plate comprises:

a lever mounted on said first edge, for operating said latch head to move between said latching position of said latch head to said unlatching position of said latch head.

12. An electronic device housing assembly of claim 7, wherein said dummy surface plate further comprises:

a plurality of elastic members mounted on said dummy surface plate, for shielding a gap between said partial region and an adjacent partial region of said insertion opening.

* * * * *